(12) United States Patent
Ueno et al.

(10) Patent No.: US 7,898,341 B2
(45) Date of Patent: Mar. 1, 2011

(54) NON-INVERTING AMPLIFIER CIRCUIT AND OPTICAL SWITCH DRIVER CIRCUIT

(75) Inventors: Tomohiro Ueno, Kawasaki (JP); Masaji Noguchi, Kawasaki (JP); Yutaka Kai, Kawasaki (JP); Setsuo Yoshida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 169 days.

(21) Appl. No.: 12/230,260

(22) Filed: Aug. 26, 2008

(65) Prior Publication Data

US 2009/0058534 A1    Mar. 5, 2009

(30) Foreign Application Priority Data

Aug. 29, 2007    (JP) ................................. 2007-222741

(51) Int. Cl.
*H03F 3/08* (2006.01)

(52) U.S. Cl. ...................................................... 330/308

(58) Field of Classification Search .............. 330/9, 277, 330/308; 327/129; 250/214 A, 214 AG
See application file for complete search history.

(56) References Cited

U.S. PATENT DOCUMENTS

| 3,753,140 | A | * | 8/1973 | Feistel | ........................... 330/109 |
| 4,899,115 | A | * | 2/1990 | Christian | ...................... 330/302 |
| 2008/0068051 | A1 | | 3/2008 | Noguchi | |

FOREIGN PATENT DOCUMENTS

| JP | 2005-208178 | 8/2005 |
| JP | 2006-254303 | 9/2006 |
| JP | 2008-076554 | 4/2008 |

\* cited by examiner

*Primary Examiner* — Khanh V Nguyen
(74) *Attorney, Agent, or Firm* — Fujitsu Patent Center

(57) ABSTRACT

A non-inverting amplifier circuit is disclosed that includes an operational amplifier and a preemphasis circuit connected between the operational amplifier and a signal source. The preemphasis circuit is configured to compensate for the internal delay of a load connected to the output of the operational amplifier by emphasizing a high-frequency component of a signal fed from the signal source.

4 Claims, 19 Drawing Sheets

FIG.1 RELATED ART
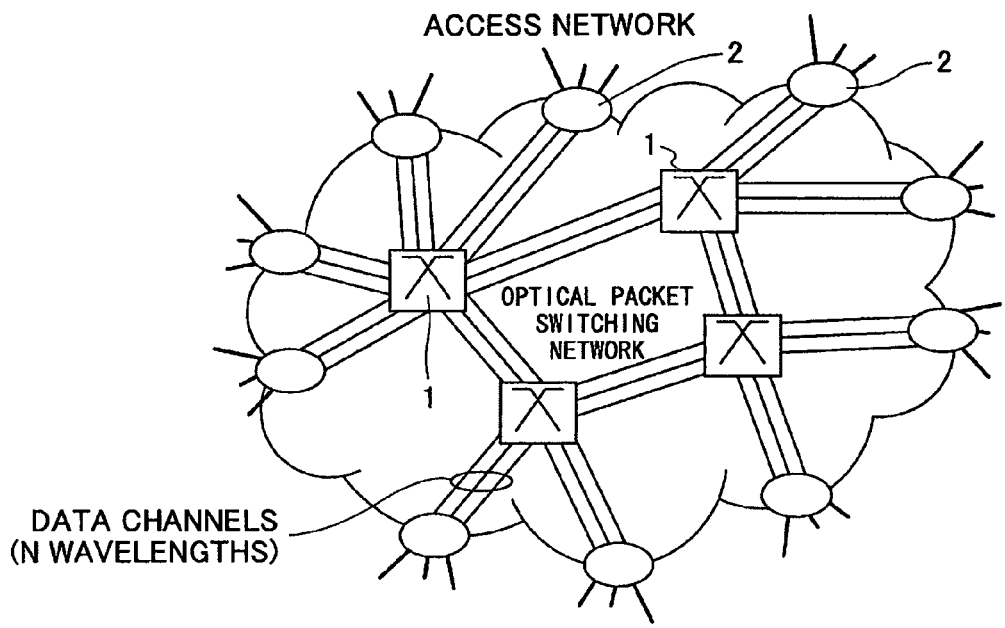
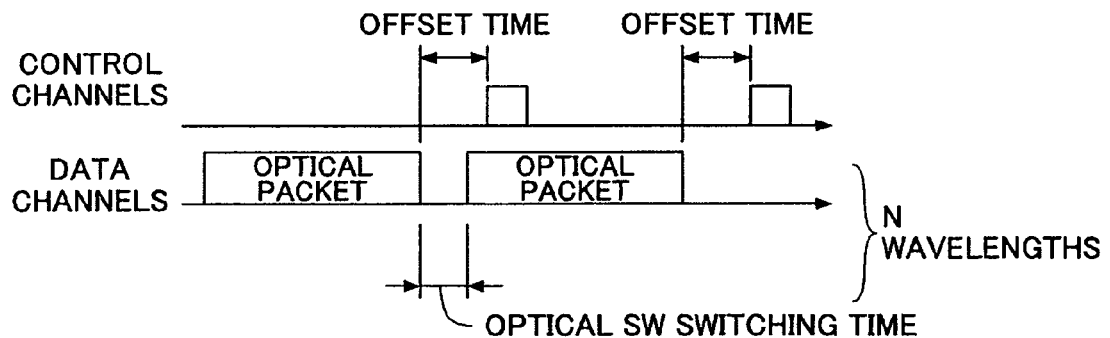

US 7,898,341 B2

NON-INVERTING AMPLIFIER CIRCUIT AND OPTICAL SWITCH DRIVER CIRCUIT

BACKGROUND OF THE INVENTION

1. Field of the Invention

The present invention relates generally to non-inverting amplifier circuits and optical switch driver circuits, and more particularly to a non-inverting amplifier circuit and an optical switch driver circuit that improve the sound quality of an audio signal having partly thinned-out spectrum components by performing interpolation on the thinned-out spectrum components.

2. Description of the Related Art

There has been a demand for high-speed and large-capacity optical communications devices toward future construction of a multimedia network. Research and development has been carried out on an optical packet switching system using a high-speed optical switch of an order of magnitude of nanoseconds (ns) as a system for achieving this high speed and large capacity.

The SOA (Semiconductor Optical Amplifier) gate-type optical switch, which is a device capable of high-speed switching of an order of magnitude of ns, is expected to be applied to the optical packet switching system.

FIG. 1 is a diagram showing an optical packet switching network. In FIG. 1, the optical packet switching network includes multiple core nodes 1 and multiple edge nodes 2. Each core node 1 has a matrix optical switch function for switching the optical path of an optical packet signal.

FIG. 2 is a diagram showing the core node 1. In FIG. 2, an optical packet signal DATA is subjected to wavelength conversion in a wavelength conversion part 5. The optical packet signal DATA subjected to wavelength conversion has its path switched to an output destination port indicated by a reservation manager part 6a of a control part 6 in a matrix optical switch part 7. A control channel part 6b in the control part 6 relays the path information of the optical packet signal DATA as the label signal of a control channel, and the reservation manager part 6a controls the matrix optical switch part 7 by analyzing the path information of the label signal.

As shown in FIG. 1, the optical switch performs switching after a certain offset time after a label signal having the path information of a control channel. This optical switch switching time is approximately 45 ns and is also a guard time for preventing an optical packet signal from being affected. That is, optical switching should be completed within this guard time.

FIG. 3 is a diagram showing a distribution-type matrix optical switch using SOA gate-type optical switches. In FIG. 3, in input port parts, corresponding optical packet signals are distributed in optical couplers 10-1 through 10-$n$, and are thereafter subjected to desired path switching by ON/OFF speed selection of SOA gate-type optical switches 11-1-1 through 11-$n$-$n$. In output port parts, the optical packet signals are combined by respective multiplexing couplers 12-1 through 12-$n$, and are output.

In FIG. 3, an optical packet signal #$n$ (whose output destination is an output port #$n$) input to an input port #1 is subjected to n-branching in the optical coupler 10-1. An optical signal subjected to n-branching is input to corresponding ones of the SOA gate-type optical switches 11-1-1 through 11-$n$-$n$, which are provided on an output port basis. In this case, since the optical packet signal #$n$ is to be output to the output port #$n$, only the SOA gate-type optical switches 11-$n$-1 is turned ON provided in the output port part corresponding to the output port #$n$. The other optical switch gates provided at the other output ports are turned OFF.

FIG. 4 is a diagram showing a configuration for driving an SOA gate-type optical switch. In FIG. 4, an SOA gate-type optical switch 20 is a device capable of amplifying an optical signal propagating through an optical signal amplification region 21 by injecting current into the optical signal amplification region 21. The SOA gate-type optical switch 20 is used as a gate element for an optical packet signal by performing ON-OFF control on its drive current.

FIG. 4 shows that the drive current is controlled for input optical packet signals #1, #2, and #3 so that the gate is ON for the optical packet signals #1 and #3 and is OFF for the optical packet signal #2. A control signal from the control part 6 is converted into a form of current in a driver circuit 22 to be fed to the optical signal amplification region 21, thereby driving the SOA gate-type optical switch 20.

FIG. 5 is a characteristic diagram showing the relationship between the drive current and optical amplification factor of the SOA gate-type optical switch. The SOA, which is a semiconductor optical amplifier, has the characteristic that its optical amplification factor is caused to vary by a drive current. FIG. 5 shows that an optical amplification factor of approximately 10 dB is obtained and the optical amplification factor is substantially saturated at a drive current of approximately 300 mA. An optical attenuation characteristic is shown as the drive current is reduced.

FIG. 6 is a characteristic diagram showing the relationship between the drive voltage and optical amplification factor of the SOA gate-type optical switch. The SOA, which is a current-driven type, may also be driven by voltage by applying voltage from a voltage source capable of causing a current of 300 mA or more to flow. FIG. 6 shows that a drive current of approximately 300 mA flows when a voltage source of approximately 1.5 V is given. An optical attenuation characteristic is shown as the drive voltage is reduced.

FIG. 7 is a characteristic diagram showing the relationship between the drive voltage of the SOA gate-type optical switch and the inter-SOA gate-type optical switch extinction ratio. In the matrix-type optical switch configuration shown in FIG. 3, SOA gate-type optical switches corresponding to the number of output ports are connected to each of the multiplexing couplers 12-1 through 12-$n$ of the output part, and if one of the SOA gate-type optical switch is turned ON, the remaining SOA gate-type optical switches are turned OFF.

However, there is leakage of light even in the OFF state, and this causes crosstalk of light in the multiplexing couplers 12-1 through 12-$n$. FIG. 7 is a graphical representation of this crosstalk of light as an extinction ratio characteristic. For example, in the case of configuring an 8×8 matrix-type optical switch, approximately 58 dB is required as an extinction ratio characteristic between ON state and OFF state. In order to obtain this extinction ratio characteristic, the drive voltage should be less than or equal to 0.65 V.

FIG. 8 is a circuit diagram of a conventional SOA gate-type optical switch driver circuit. FIG. 9 is a waveform chart for illustrating the rising operating speed of the circuit shown in FIG. 8. FIG. 10 is a waveform chart for illustrating the falling operating speed of the circuit shown in FIG. 8.

FIG. 8 shows a circuit that drives an SOA gate-type optical switch, using a high-speed operational amplifier 30 that has an output current capacity of 300 mA or more and has a settling time of approximately 2 ns. The operational amplifier 30 forms a voltage follower circuit.

A delay equivalent circuit 32 formed of inductors L2 and L3 and a capacitor C1 connected to the output of the operational amplifier 30 is a circuit component equivalent to the internal delay of an SOA chip. A switch equivalent circuit 33 formed of a diode D1 is a circuit component equivalent to the optical switch of the SOA chip.

A square wave signal for switching ON and OFF the optical switch is fed to the non-inverting input of the operational amplifier 30. FIG. 8 shows the configuration where the input square wave signal is fed from a signal generator (SG) 31. In general, however, a desired square voltage waveform is provided by an FPGA (field-programmable gate array) circuit or logic buffer circuit based on a control signal from the control part 6.

The waveform of the signal generator 31 is determined to be 1.5 V at ON time and 0 V at OFF time. The voltage follower output is determined to be the same voltage value as the input voltage. If the output voltage of the operational amplifier 30 is 1.5 V, a drive current of approximately 300 mA flows through the SOA chip to turn ON the gate of the SOA chip. If the output voltage of the operational amplifier 30 is 0 V, no drive current flows through the SOA chip to turn OFF the gate of the SOA chip. At this point, a sufficient extinction ratio is maintained. The delay equivalent circuit 32 has a time constant of approximately 3 ns, and the sum of this time constant and the rise time and fall time of the optical switch driver circuit is an actual drive time.

Referring to FIG. 9, the output voltage waveform of the operational amplifier 30 indicated by a solid line achieves a 0 to 90% rising edge of approximately 1 ns, while the 0 to 90% rising edge is slow and approximately 4 ns in the voltage waveform after passing through the delay equivalent circuit 32 having a time constant of 3 ns indicated by a broken line. As a result, the 0 to 90% rising edge is also slow and approximately 4 ns in the current waveform of the switch equivalent circuit 33 indicated by a single-dot chain line.

Referring to FIG. 10, the output voltage waveform of the operational amplifier 30 indicated by a solid line achieves a 100 to 10% falling edge of approximately 1 ns, while the 100 to 10% falling edge is slow and approximately 4 ns in the voltage waveform after passing through the delay equivalent circuit 32 indicated by a broken line. As a result, the 100 to 10% falling edge is also slow and approximately 4 ns in the current waveform of the switch equivalent circuit 33 indicated by a single-dot chain line. Thus, the time constant of the internal delay of the SOA chip affects the rising time and falling time of a drive signal, so that an increase in speed is prevented.

Japanese Laid-Open Patent Application No. 2006-254303 shows connecting an input buffer to signal lines and inductors in a circuit including a driver IC subjected to preemphasis.

Japanese Laid-Open Patent Application No. 2005-208178 shows connecting a current source to the driving electrode of an SOA through an inductor for stabilizing the operation of the SOA.

Japanese Laid-Open Patent Application No. 2006-253339 shows connecting an inductor between an operational amplifier and an SOA electrode in an SOA driver circuit.

A high switching speed is required for driving the SOA gate-type optical switch. Therefore, components capable of high-speed operation should be selected in the driver circuit. However, even if the speed is high on the driver circuit side, there is an existing time constant of approximately 3 ns due to the internal delay of the SOA chip. This time constant serves as an impediment to high-speed switching, thus resulting in a slow rising and falling waveform. Therefore, as a method of solving this problem, there is provided a preemphasis-type driver circuit using a speed-up capacitor C4 and a high-speed transistor Q1 as shown in FIG. 11.

FIG. 11 shows a circuit diagram of a conventional SOA gate-type optical switch driver circuit using preemphasis. FIG. 12 is a waveform chart for illustrating the rising operating speed of the circuit shown in FIG. 11. FIG. 13 is a waveform chart for illustrating the falling operating speed of the circuit shown in FIG. 11.

In FIG. 11, high-frequency components are emphasized using a first-order high-pass filter formed of a capacitor C4 and a resistor R1.

According to this method, there is a problem in the stability of the driver circuit because oscillation may occur depending on the type of the transistor Q1 and the output of the transistor Q1 may be current overload. Further, when the SOA chip is connected to serve as a load, the switch equivalent circuit 32 is regarded as a capacitive load. As indicated by a solid line in FIG. 12, the SOA drive voltage rises at high speed from 0% to 90% because of the preemphasis effect.

Referring to FIG. 13, however, there is great ringing in the waveform of the output voltage of the transistor Q1 indicated by a solid line after a fast 100 to 10% falling edge due to the preemphasis effect. This ringing is also observed in the voltage waveform after passing through the delay equivalent circuit 32 indicated by a broken line and in the current waveform of the switch equivalent circuit 33 indicated by a single-dot chain line.

This is because a transient discharge occurs because of failure to absorb the reverse current generated by the release of the charge stored in the load since the transistor Q1 is open at OFF time in the existing preemphasis-type driver circuit.

As a result, because of occurrence of the ringing having amplitude substantially greater than the 1.5 V drive voltage in the output voltage waveform of the transistor Q1 and occurrence of voltage exceeding 0.65 V in the voltage waveform after passing through the delay equivalent circuit 32, there is a problem in that the extinction ratio characteristic of approximately 58 dB between the ON state and OFF state of the SOA gate-type optical switch in FIG. 7 cannot be satisfied.

SUMMARY OF THE INVENTION

Embodiments of the present invention may solve or reduce one or more of the above-described problems.

According to one embodiment of the present invention, a non-inverting amplifier circuit and an optical switch driver circuit are provided in which one or more of the above-described problems may be solved or reduced.

According to one embodiment of the present invention, a non-inverting amplifier circuit and an optical switch driver circuit are provided that are capable of driving a load at high speed by reducing the effect of the internal delay of the load.

According to one embodiment of the present invention, a non-inverting amplifier circuit is provided that includes an operational amplifier; and a preemphasis circuit connected between the operational amplifier and a signal source, the preemphasis circuit being configured to compensate for an internal delay of a load connected to an output of the operational amplifier by emphasizing a high-frequency component of a signal fed from the signal source.

According to one embodiment of the present invention, an optical switch driver circuit is provided that includes a non-inverting amplifier circuit, the non-inverting amplifier circuit including an operational amplifier; and a preemphasis circuit connected between the operational amplifier and a signal source, the preemphasis circuit being configured to compensate for an internal delay of a semiconductor optical amplifier connected to an output of the operational amplifier by emphasizing a high-frequency component of a signal fed from the signal source, wherein the preemphasis circuit includes a first resistor connecting the signal source and a non-inverting input of the operational amplifier; and a series circuit of an inductor and a second resistor, the series circuit connecting the non-inverting input of the operational amplifier to a predetermined potential.

According to one embodiment of the present invention, an optical switch driver circuit is provided that includes a non-inverting amplifier circuit, the non-inverting amplifier circuit including an operational amplifier; and a preemphasis circuit connected between the operational amplifier and a signal source, the preemphasis circuit being configured to compensate for an internal delay of a semiconductor optical amplifier connected to an output of the operational amplifier by emphasizing a high-frequency component of a signal fed from the signal source, wherein the preemphasis circuit includes a parallel circuit of a first resistor and a capacitor, the parallel circuit connecting the signal source and a non-inverting input of the operational amplifier; and a second resistor connecting the non-inverting input of the operational amplifier to a predetermined potential.

According to one aspect of the present invention, it is possible to reduce the effect of the internal delay of a load and drive the load at high speed.

BRIEF DESCRIPTION OF THE DRAWINGS

Other objects, features and advantages of the present invention will become more apparent from the following detailed description when read in conjunction with the accompanying drawings, in which:

FIG. 1 is a diagram showing an optical packet switching network;

DETAILED DESCRIPTION OF THE PREFERRED EMBODIMENTS

A description is given below, with reference to the accompanying drawings, of embodiments of the present invention.

First Embodiment

Figure 2:
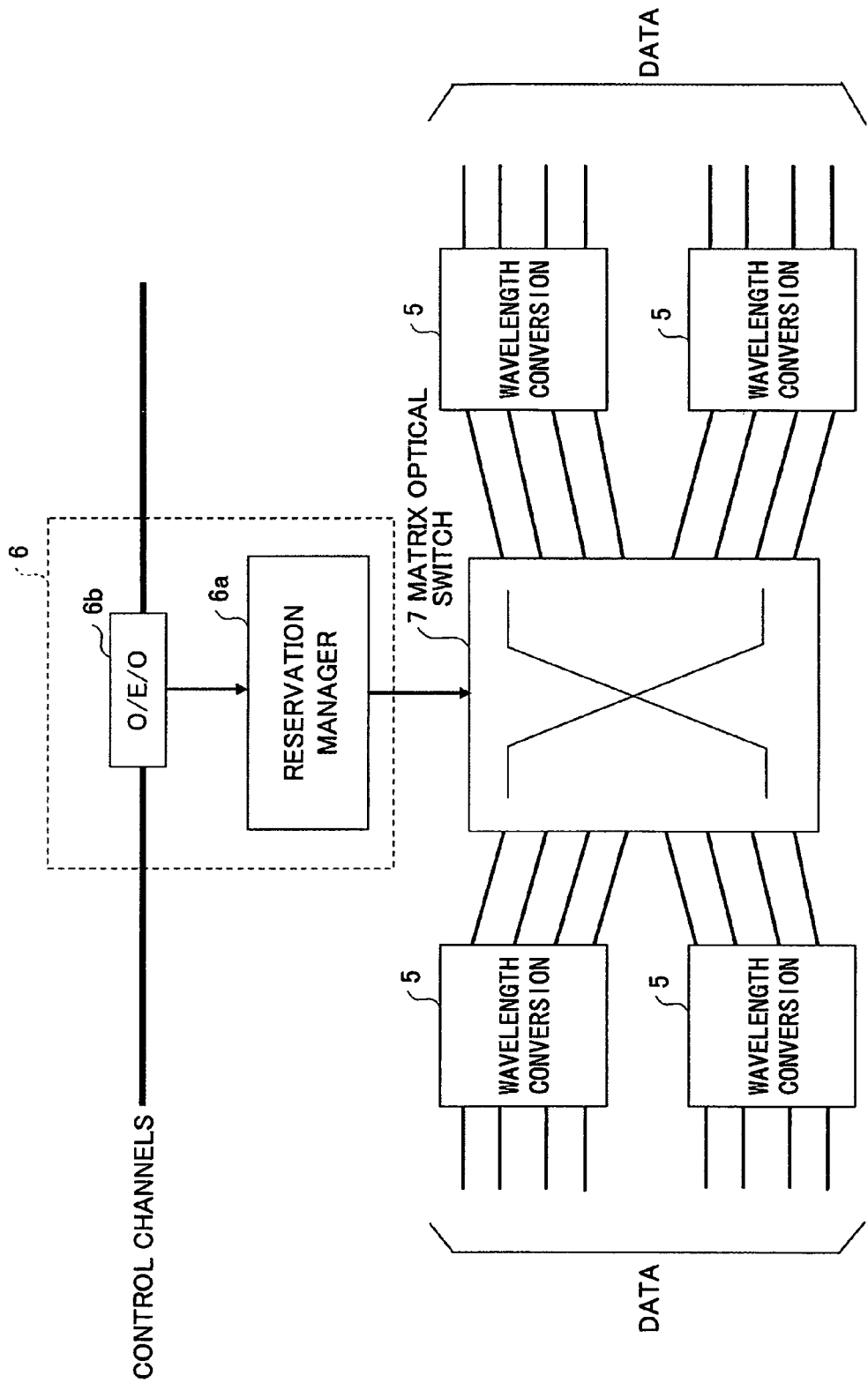
FIG. 2 is a diagram showing a core node.
Figure 3:
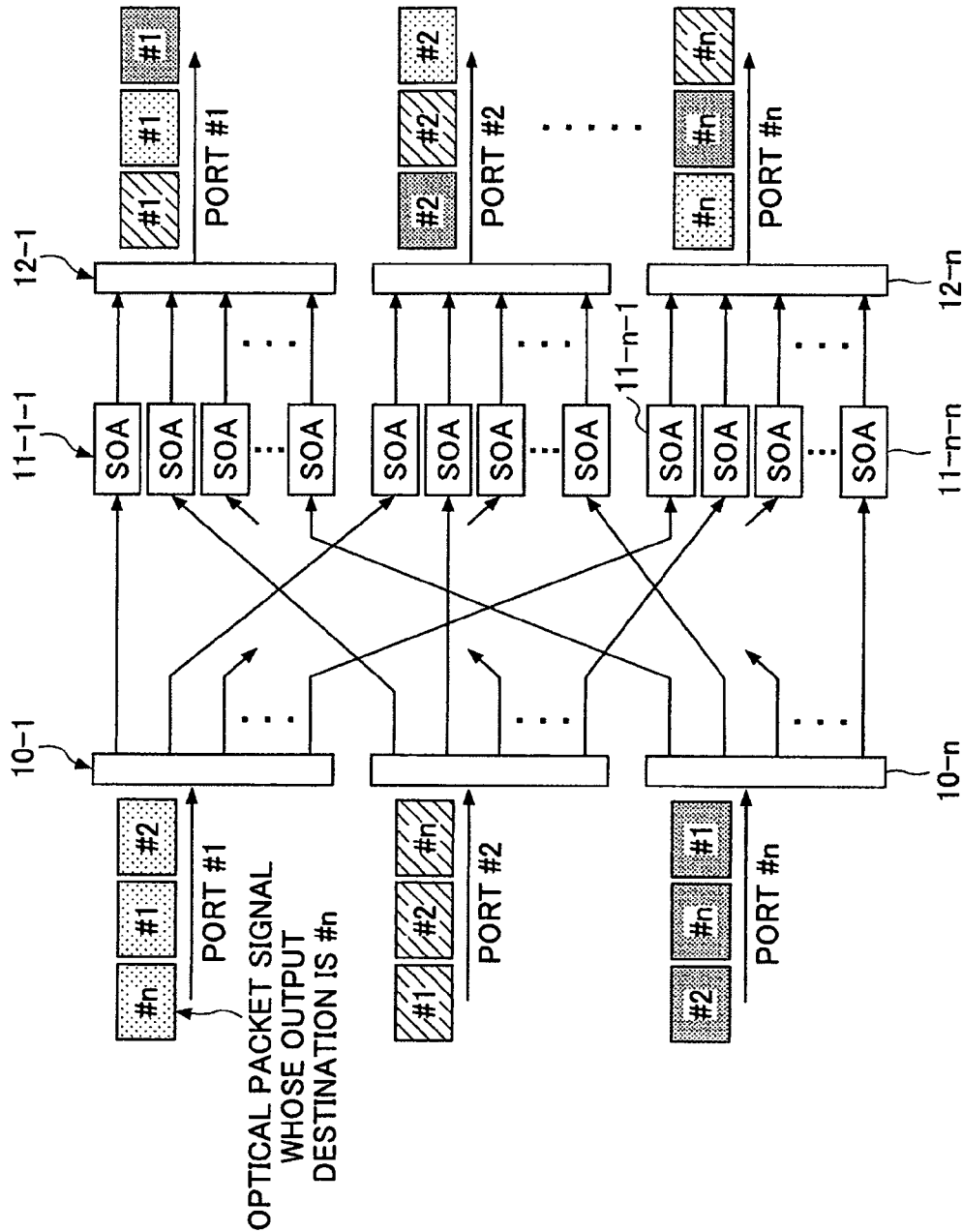
FIG. 3 is a diagram showing a distribution-type matrix optical switch using SOA gate-type optical switches.
Figure 4:
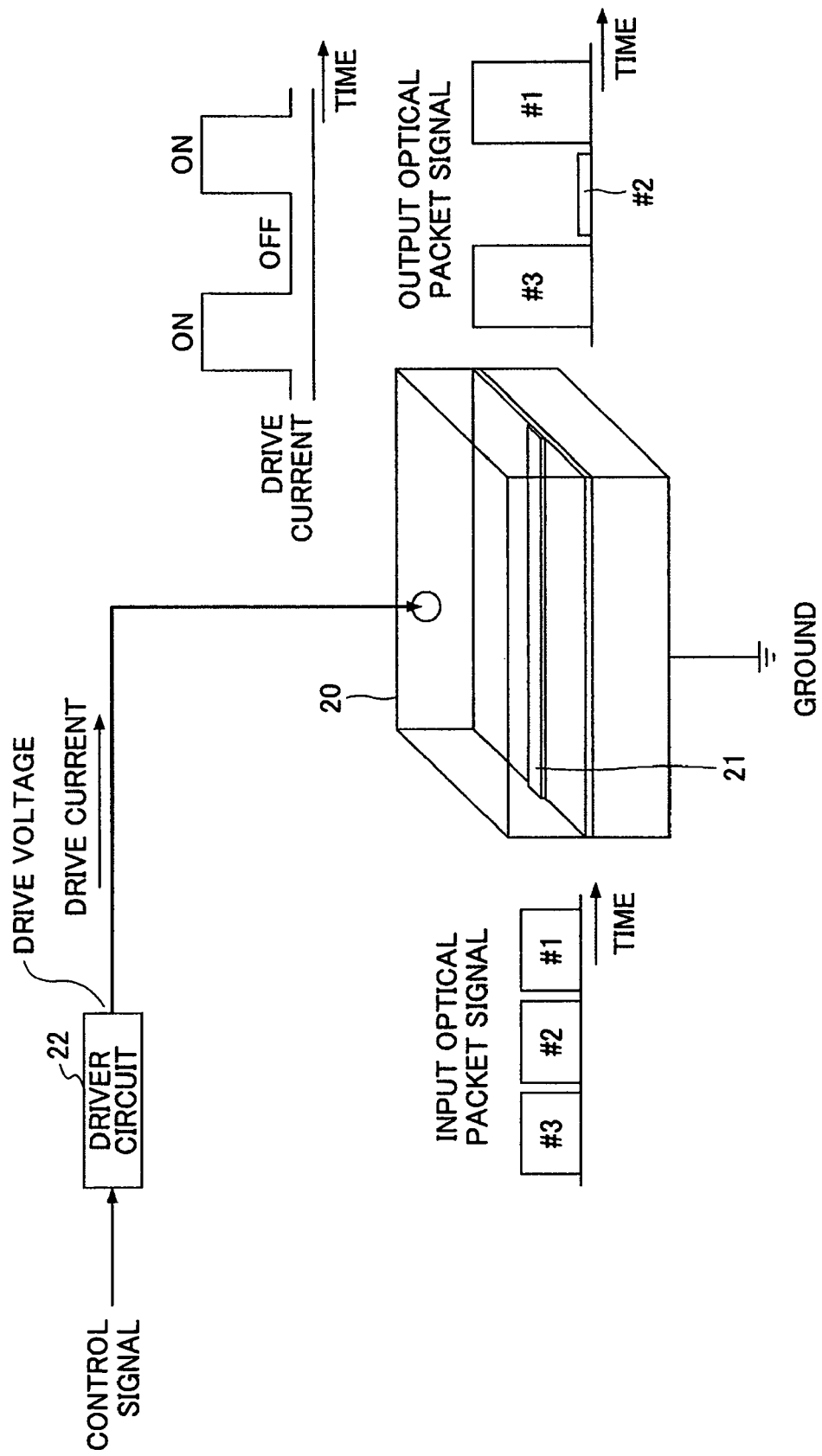
FIG. 4 is a diagram showing a configuration for driving an SOA gate-type optical switch.
Figure 5:
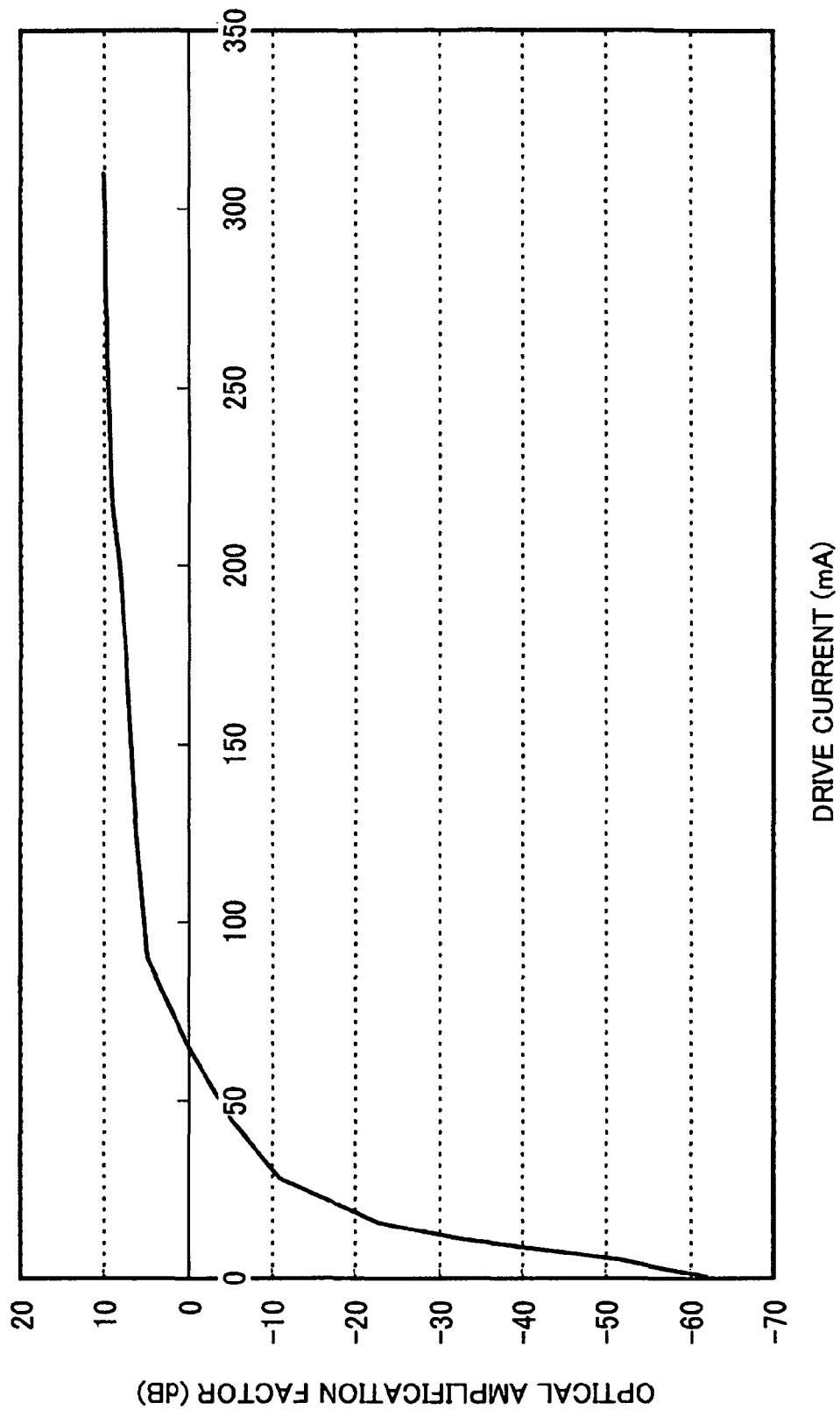
FIG. 5 is a characteristic diagram showing the relationship between the drive current and optical amplification factor of the SOA gate-type optical switch.
Figure 6:
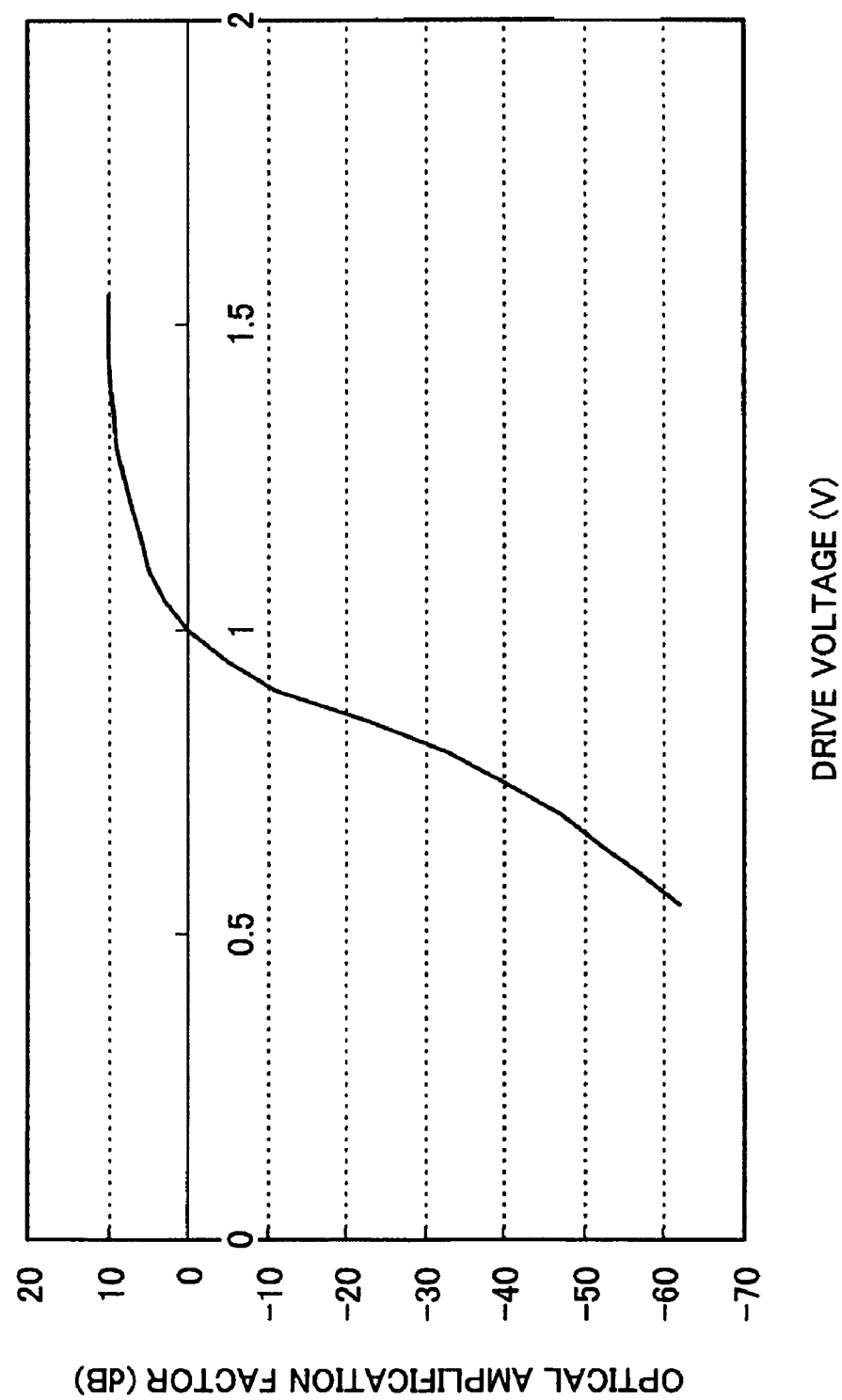
FIG. 6 is a characteristic diagram showing the relationship between the drive voltage and optical amplification factor of the SOA gate-type optical switch.
Figure 7:
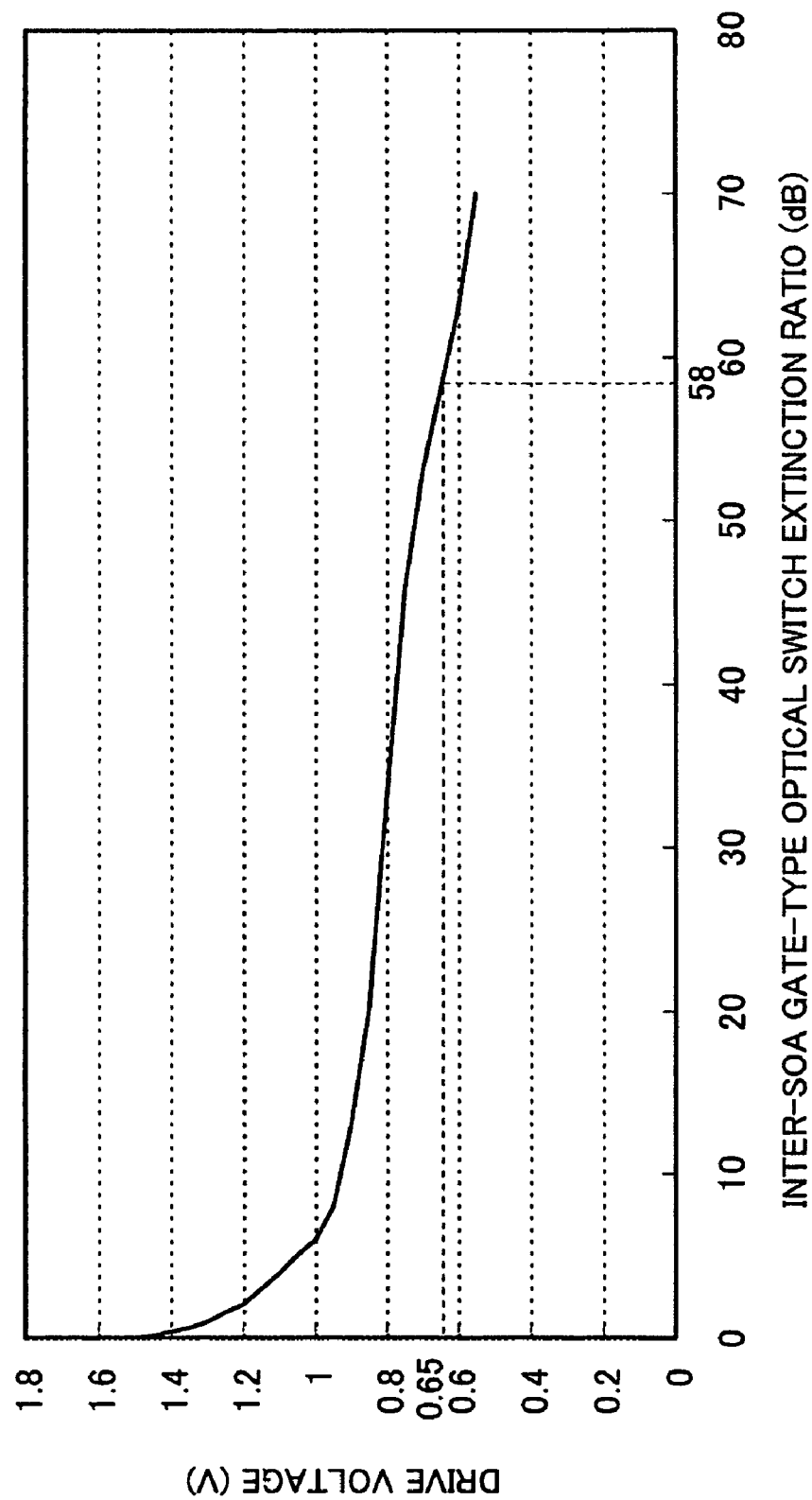
FIG. 7 is a characteristic diagram showing the relationship between the drive voltage of the SOA gate-type optical switch and the inter-SOA gate-type optical switch extinction ratio.
Figure 8:
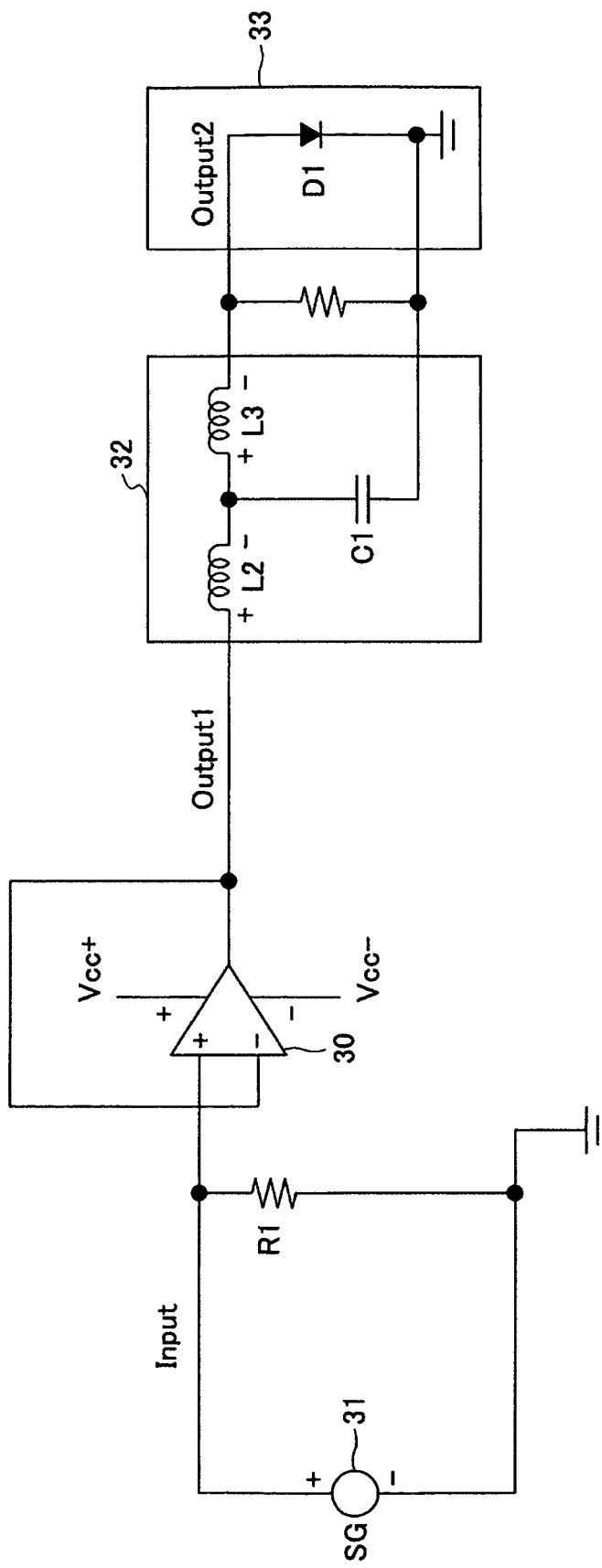
FIG. 8 is a circuit diagram of a conventional SOA gate-type optical switch driver circuit.
Figure 9:
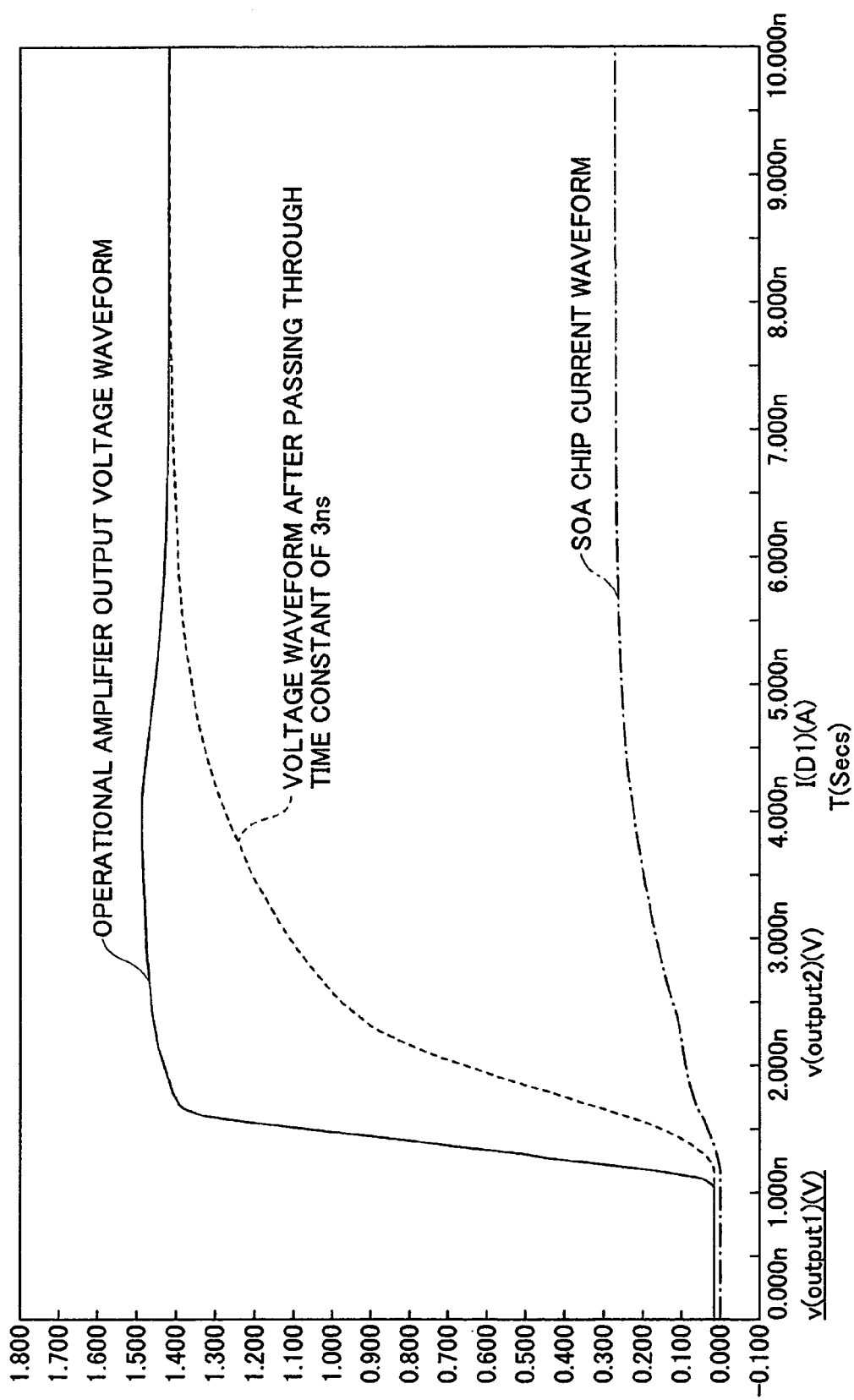
FIG. 9 is a waveform chart for illustrating the rising operating speed of the circuit shown in FIG. 8.
Figure 10:
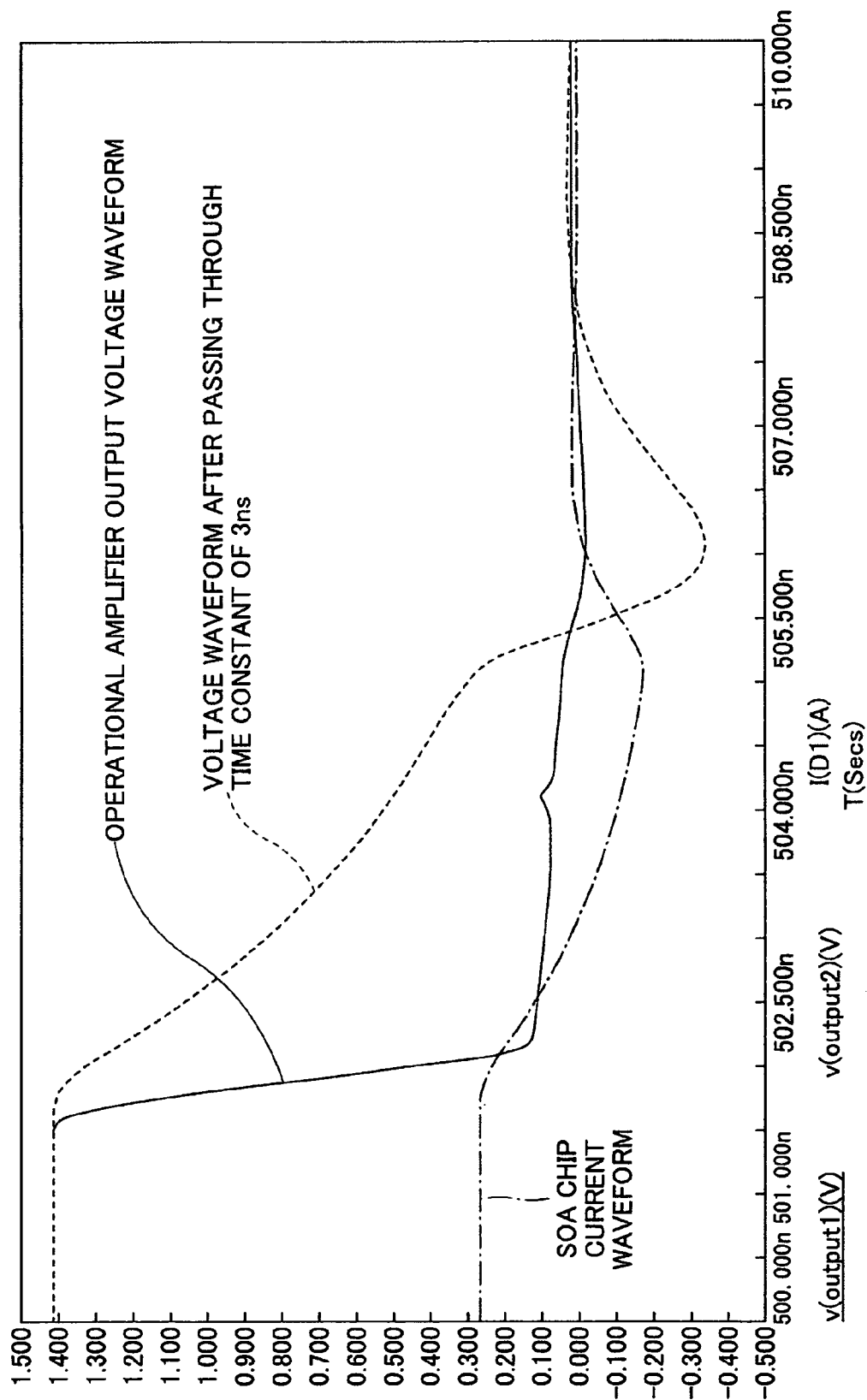
FIG. 10 is a waveform chart for illustrating the falling operating speed of the circuit shown in FIG. 8.
Figure 11:
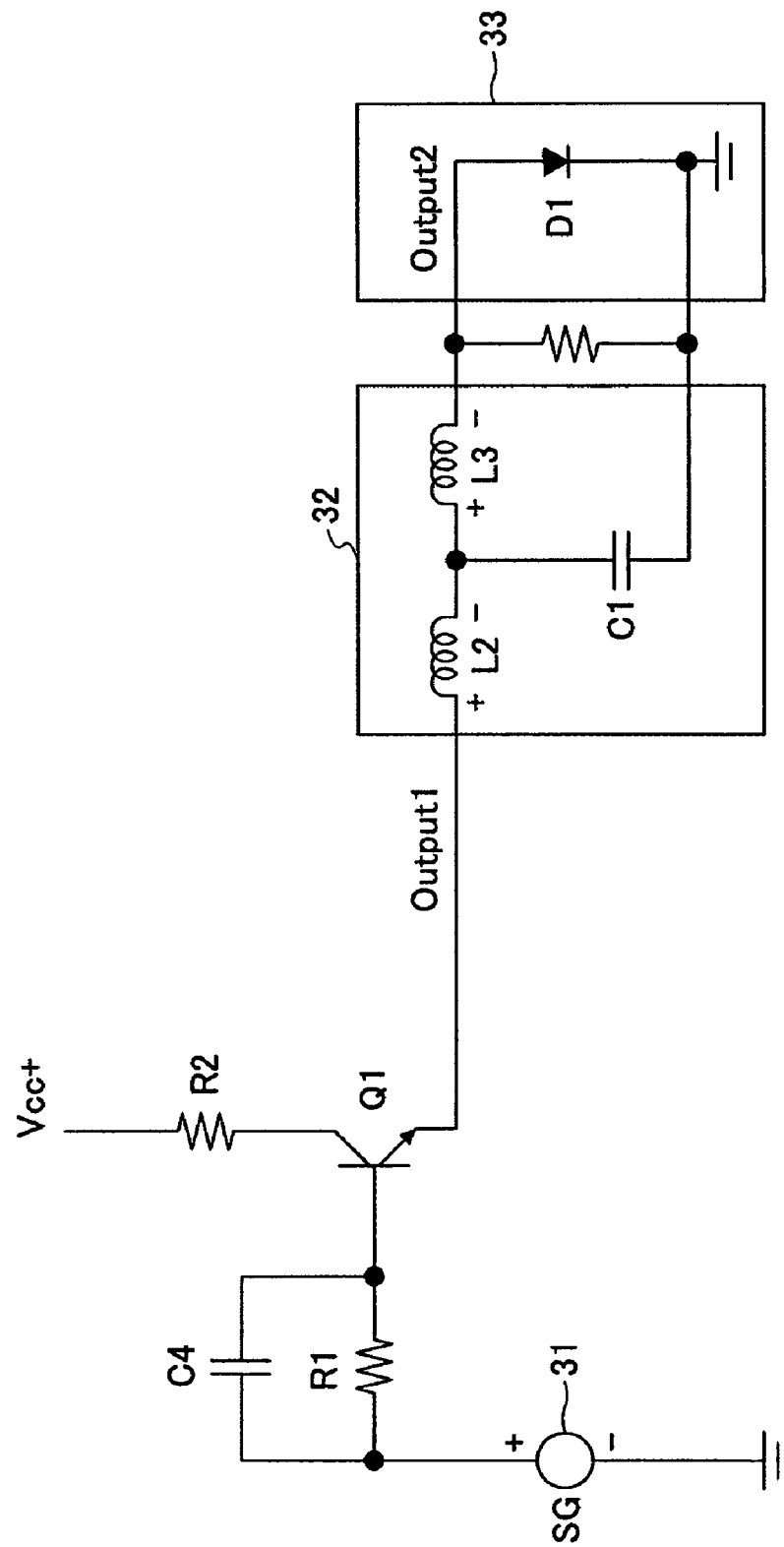
FIG. 11 is a circuit diagram of a conventional SOA gate-type optical switch driver circuit using preemphasis.
Figure 12:
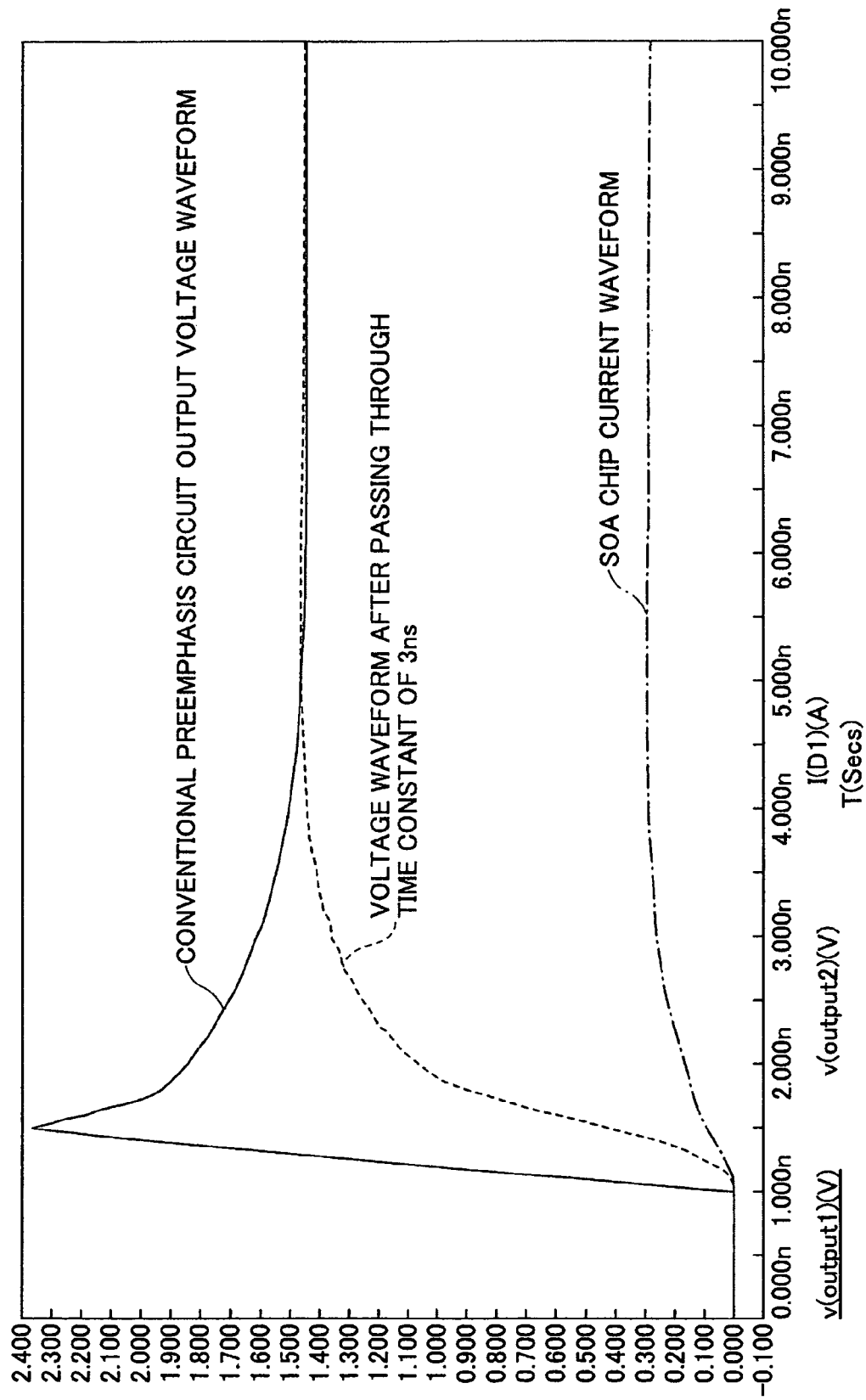
FIG. 12 is a waveform chart for illustrating the rising operating speed of the circuit shown in FIG. 11.
Figure 13:
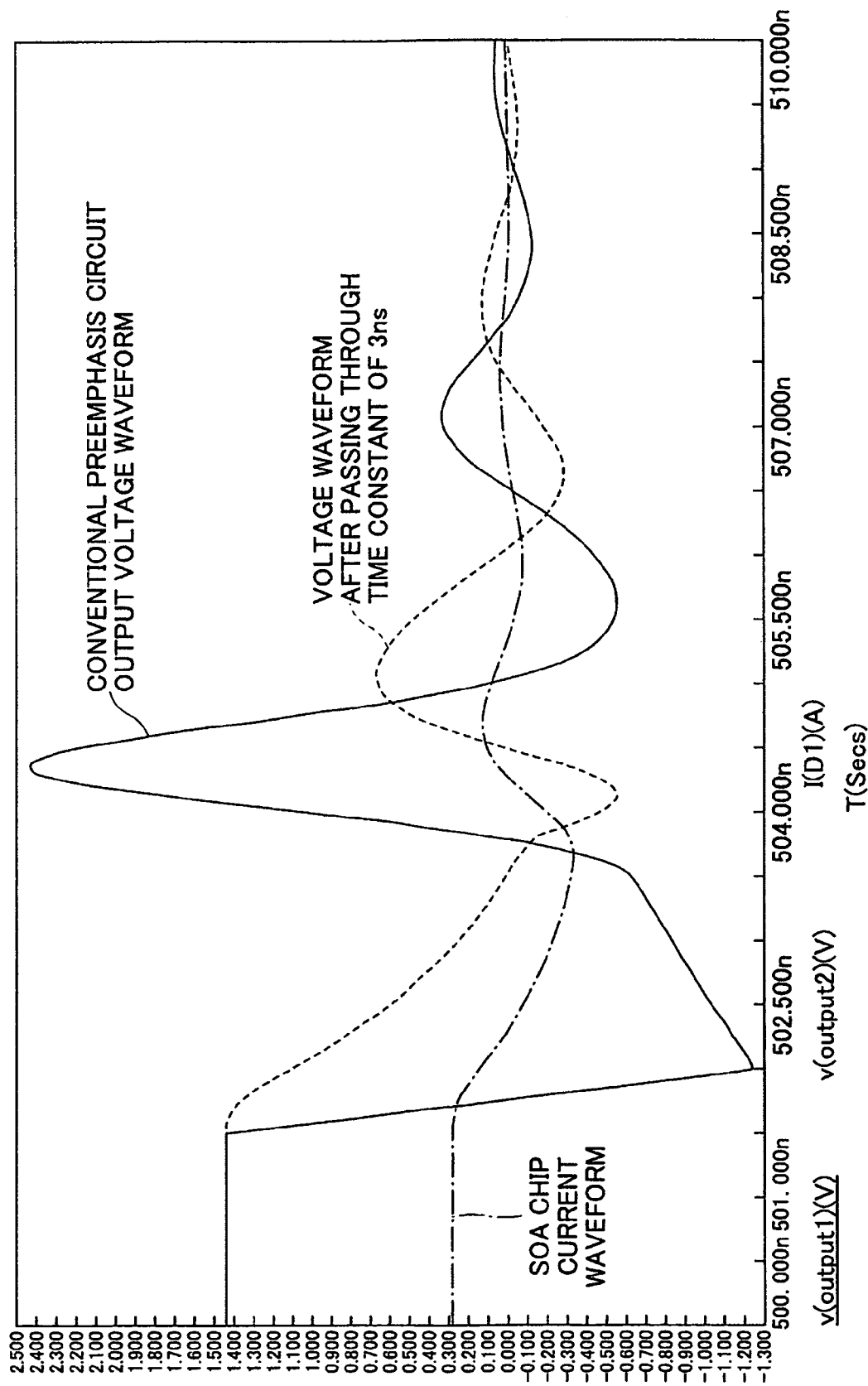
FIG. 13 is a waveform chart for illustrating the falling operating speed of the circuit shown in FIG. 11.
Figure 14:
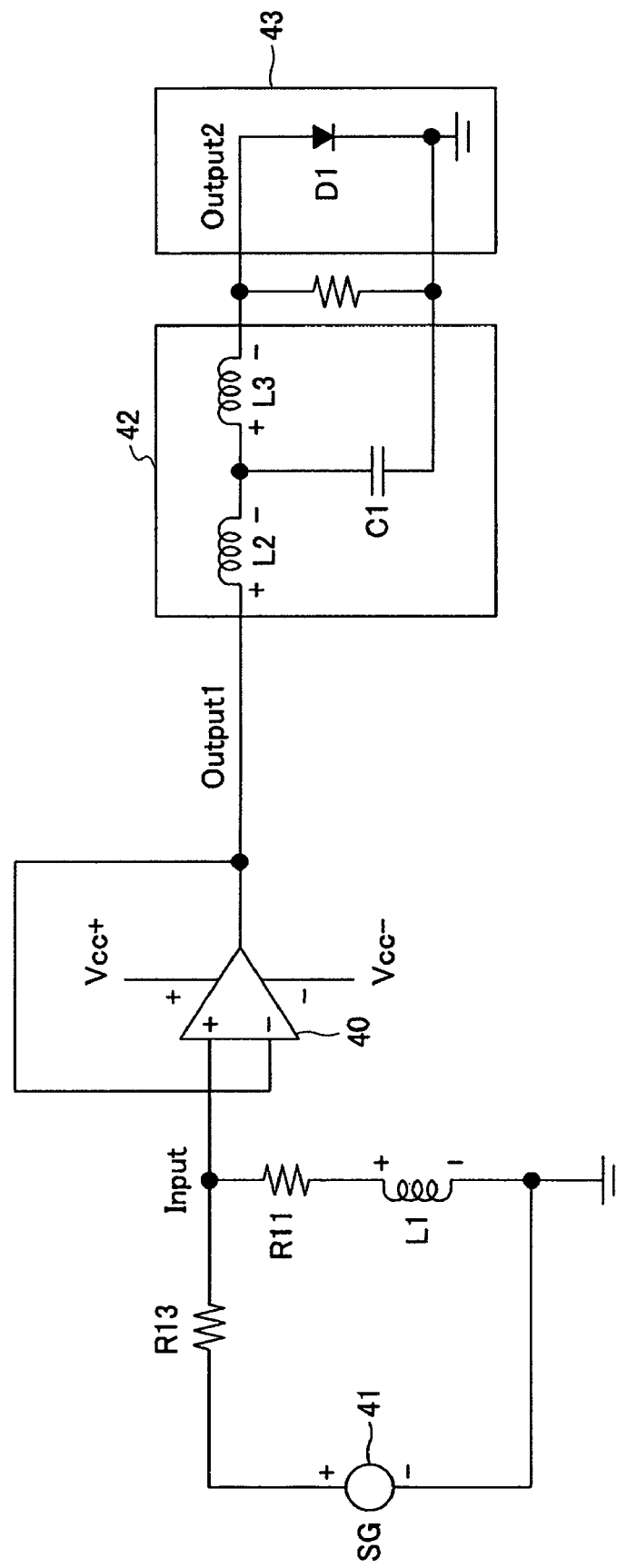
FIG. 14 is a circuit diagram showing an optical switch driver circuit according to a first embodiment of the present invention.
Figure 15:
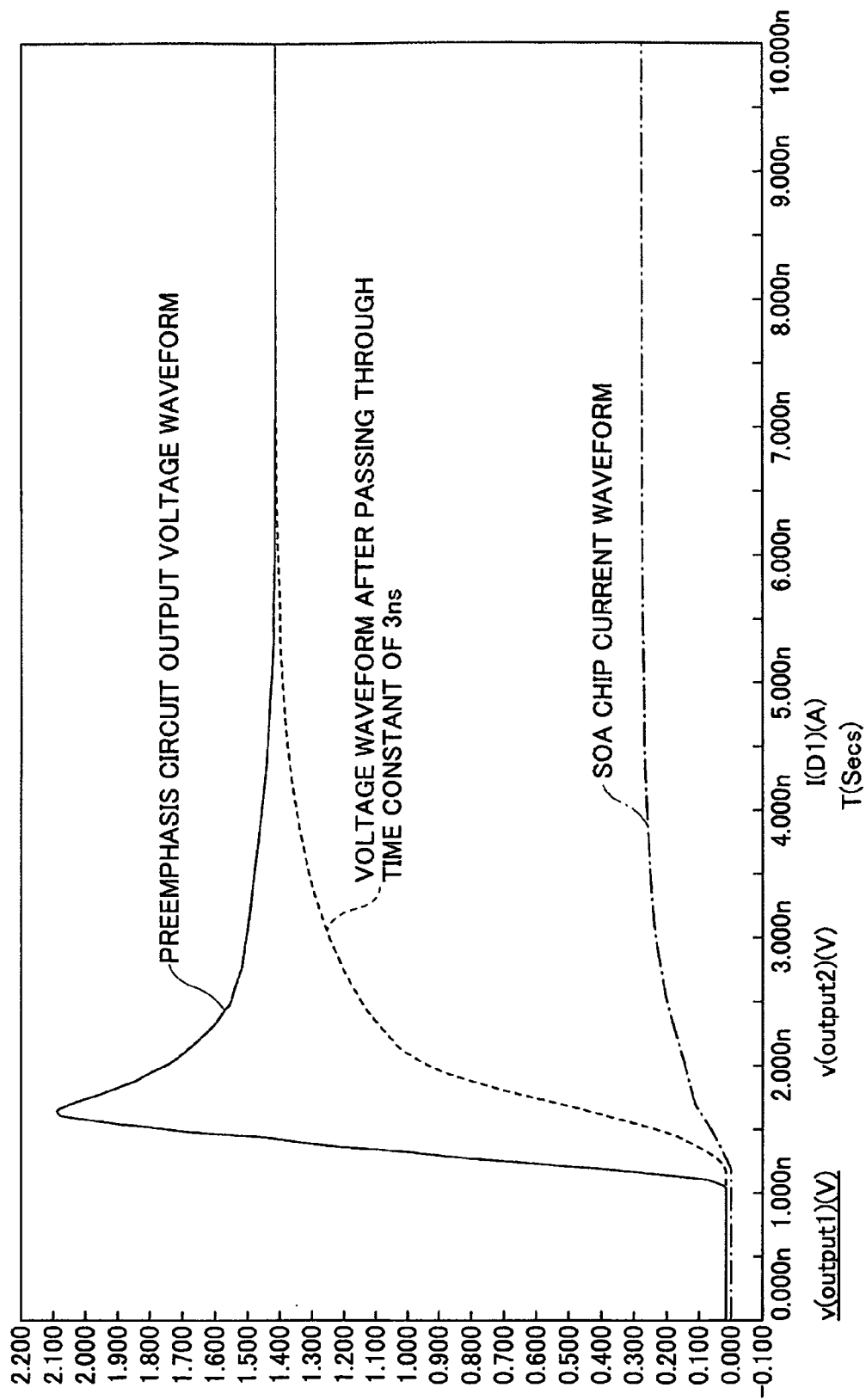
FIG. 15 is a waveform chart for illustrating the rising operating speed of the circuit shown in FIG. 14 according to the first embodiment of the present invention.
Figure 16:
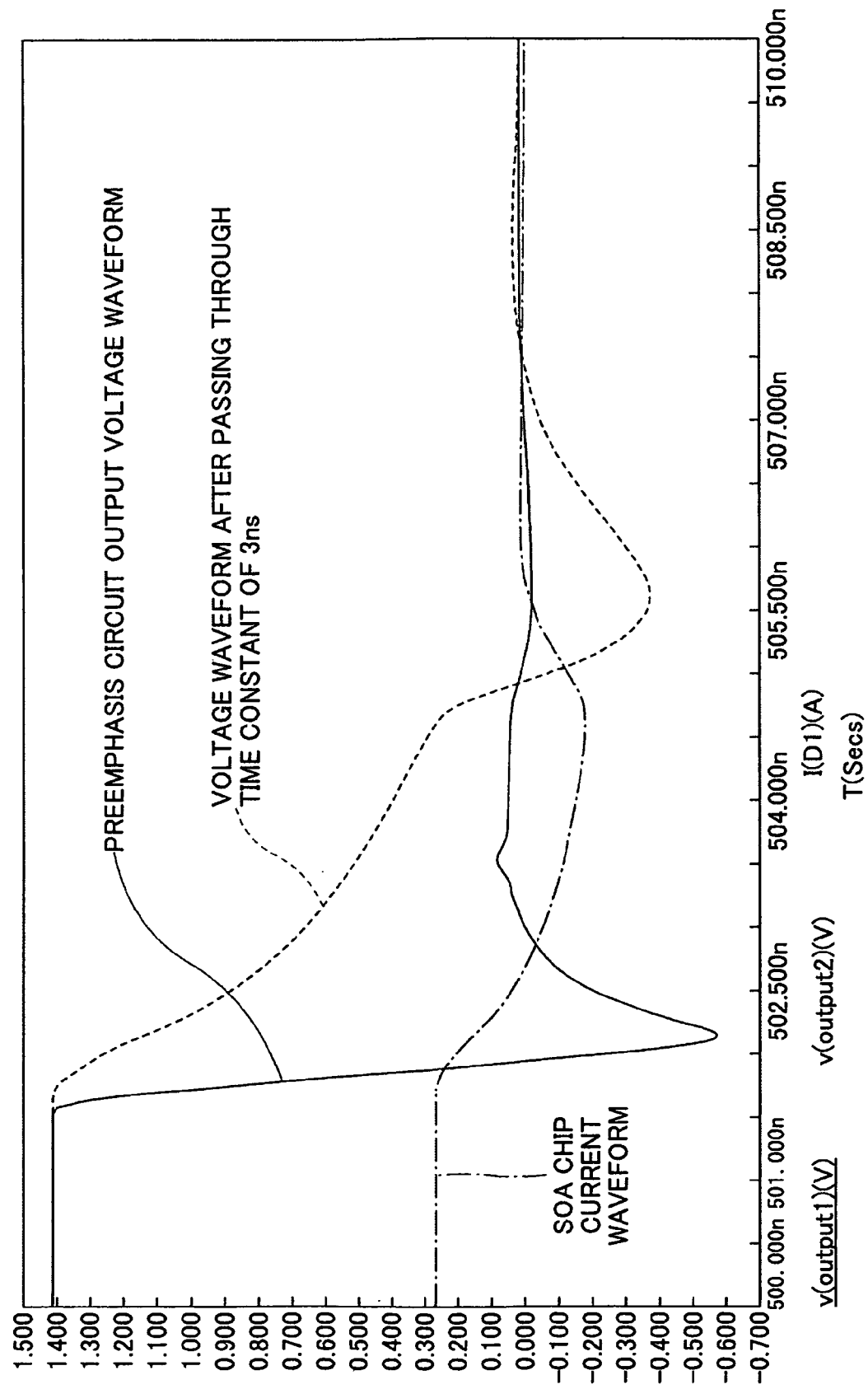
FIG. 16 is a waveform chart for illustrating the falling operating speed of the circuit shown in FIG. 14 according to the first embodiment of the present invention.

FIG. 14 is a circuit diagram showing an optical switch driver circuit according to a first embodiment of the present invention. This optical switch driver circuit is a preemphasis type. FIG. 15 is a waveform chart for illustrating the rising operating speed of the circuit shown in FIG. 14. FIG. 16 is a waveform chart for illustrating the falling operating speed of the circuit shown in FIG. 14.

FIG. 14 shows a circuit that drives an SOA gate-type optical switch, using a high-speed operational amplifier 40 that has an output current capacity of 300 mA or more and has a settling time of approximately 2 ns. The operational amplifier 40 has its output connected to its inverting input so as to form a voltage follower circuit.

A resistor R13 is connected between the positive terminal of a signal generator (SG) 41 and the non-inverting input of the operational amplifier 40. The non-inverting input of the operational amplifier 40 is grounded through a terminating resistor R11 and an inductor L1 that are connected in series. The negative terminal of the signal generator 41 is grounded. The resistor R11 and the inductor L1 may be interchanged so that the inductor L1 connects to the non-inverting input of the operational amplifier 40. Each of the resistors R11 and R13 has a resistance of, for example, 50Ω, and the inductor L1 has an inductance of, for example, 80 nH.

A delay equivalent circuit 42 including inductors L2 and L3 and a capacitor C1, which are connected to the output of the operational amplifier 40, is a circuit component equivalent to the internal delay of an SOA chip. A switch equivalent circuit 43 includes a diode D1.

A square wave generated by the signal generator 41 is divided between the resistors R13 and R11. The square wave transmitted to the inductor L1 at this point has its high-frequency components emphasized by the counter electromotive force generated by the inductor L1, so that a waveform with the emphasized high-frequency components is generated. This signal is amplified by the operational amplifier 40 to be transmitted through the delay equivalent circuit 42 to the switch equivalent circuit 43 serving as a load. At this point, the high-frequency components emphasized by the preemphasis circuit (the resistors R11 and R13 and the inductor L1) at the input stage are attenuated by the delay equivalent circuit 42. By thus transmitting the intended original square wave and thereby driving the switch equivalent circuit 43, it is possible to perform driving at high speed.

Referring to FIG. 15, a fast overshoot voltage is caused in the output voltage waveform of the operational amplifier 40 indicated by a solid line. The transient overshoot component is smoothed when this output voltage of the operational amplifier 40 passes through the delay equivalent circuit 42 having a time constant of 3 ns. As a result, the voltage waveform after passing through the delay equivalent circuit 42 indicated by a broken line in FIG. 15 has an ideal fast rising edge. Therefore, this increase in speed is also seen in the current waveform of the switch equivalent circuit 43 indicated by a single-dot chain line in FIG. 15.

Further, referring to FIG. 16, the output voltage waveform of the operational amplifier 40 indicated by a solid line has a fast falling edge from 100 to 10% with no subsequent occurrence of ringing. This is because the operational amplifier 40 absorbs a reflected current or reverse current from the SOA chip since the operational amplifier 40 has low output impedance. This enables SOA driving with a sufficient extinction ratio ensured.

Since the input voltage of the operational amplifier 40 is used in this embodiment, it is possible to isolate the effect of the SOA chip serving as a load. Further, at a fall time, the backflow current of the charge stored in the diode D1, which is the parasitic capacitance of the SOA chip, can be absorbed into the operational amplifier 40 at high speed because the output of the operational amplifier is low in impedance, so that it is possible to prevent fall-time ringing. Further, since the output current of the signal generator 41, which is a front end device of the operational amplifier 40, is small, it is possible to achieve low power consumption.

Second Embodiment

Figure 17:
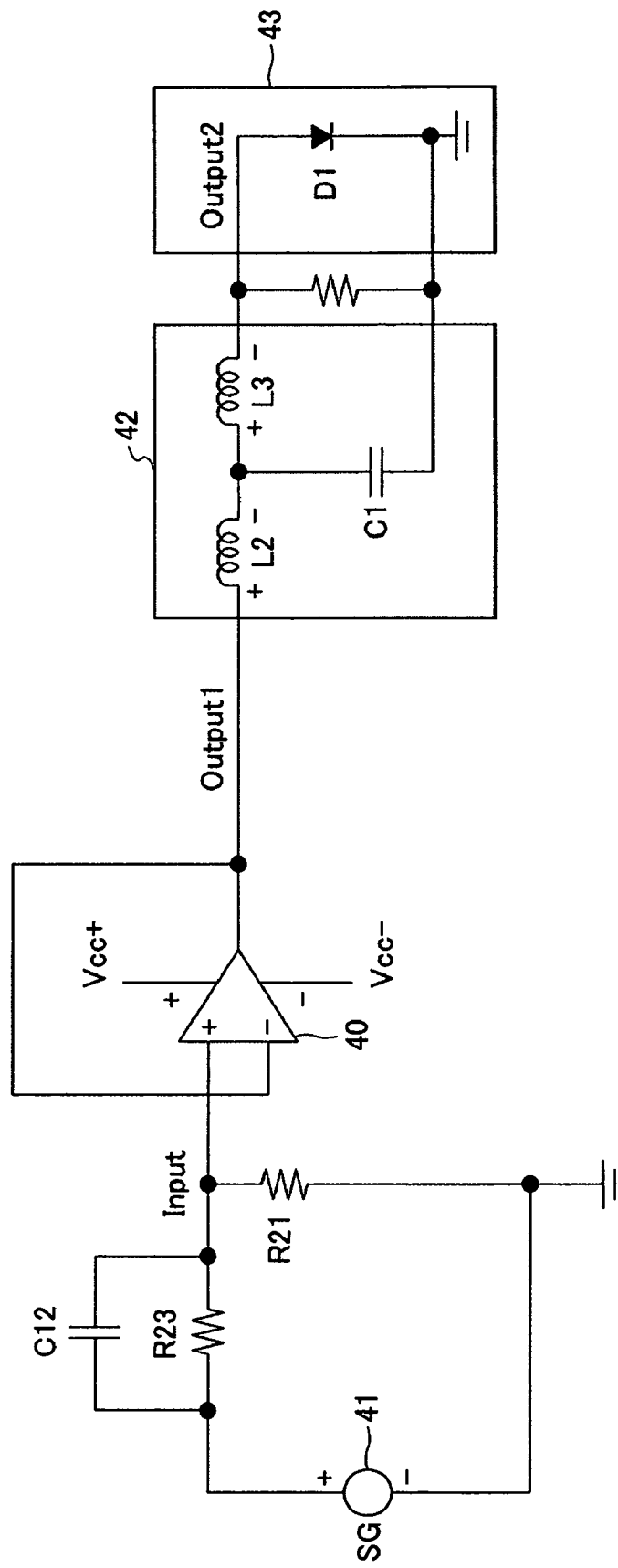
FIG. 17 is a circuit diagram showing an optical switch driver circuit according to a second embodiment of the present invention.
Figure 18:
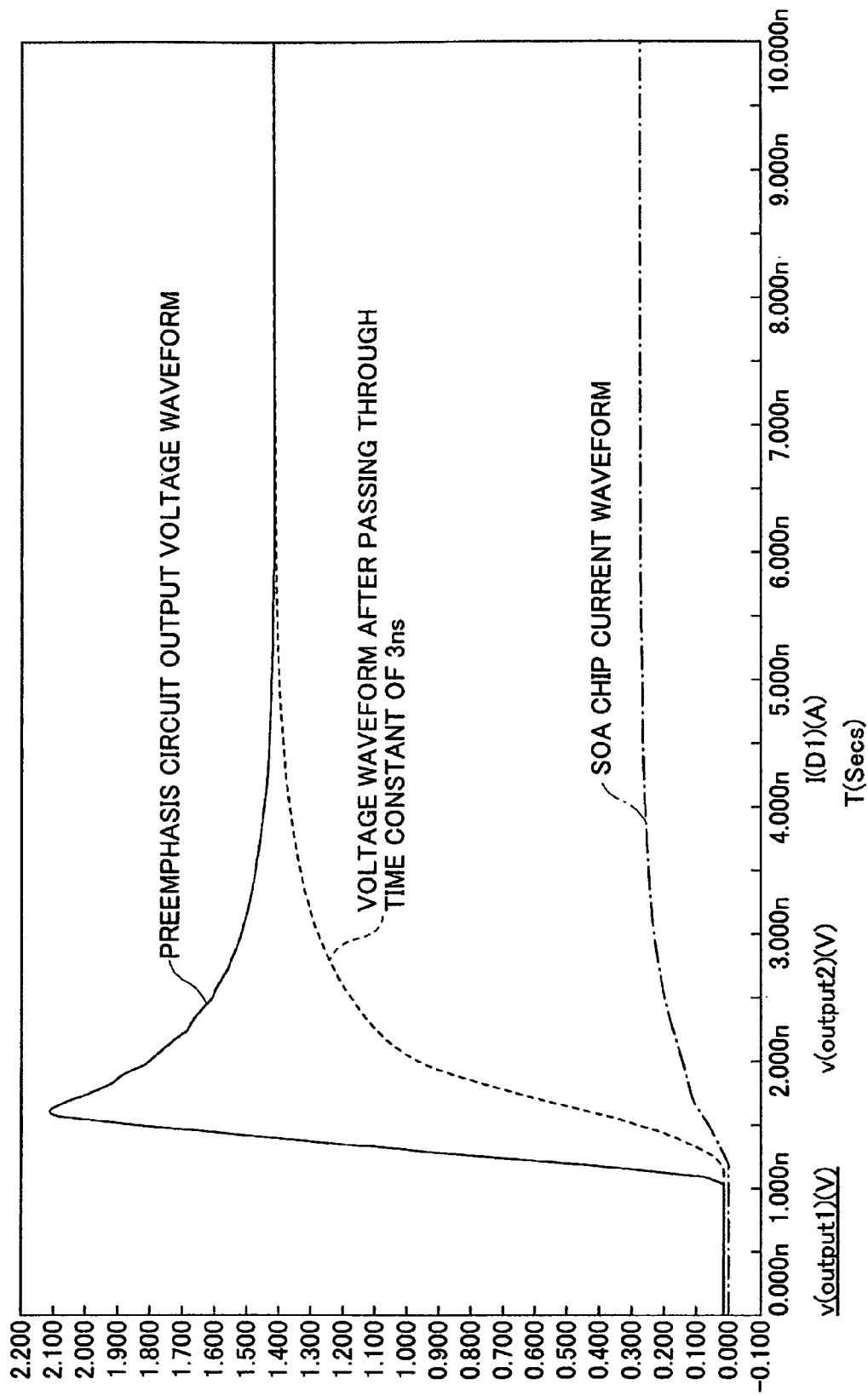
FIG. 18 is a waveform chart for illustrating the rising operating speed of the circuit shown in FIG. 17 according to the second embodiment of the present invention.
Figure 19:
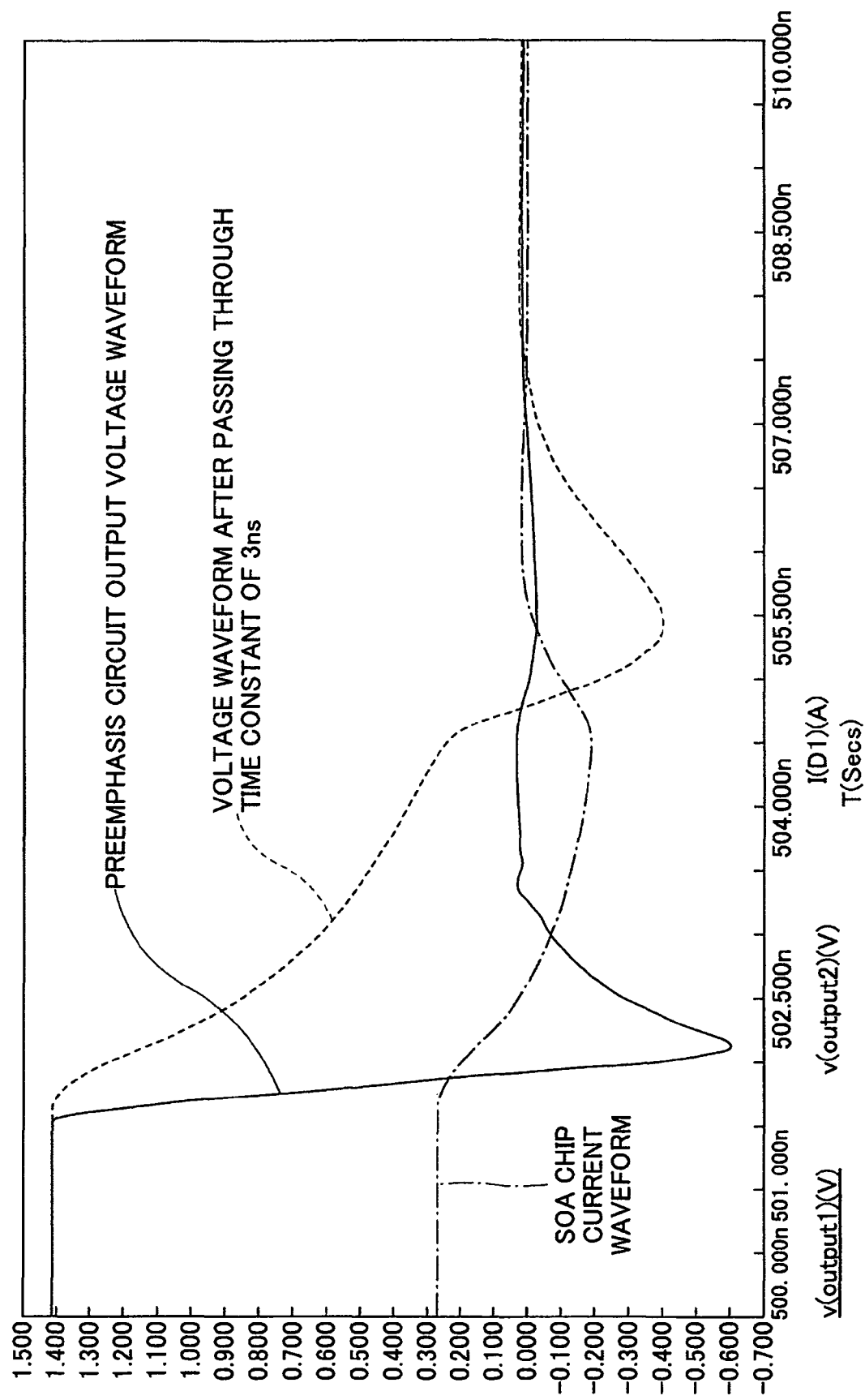
FIG. 19 is a waveform chart for illustrating the falling operating speed of the circuit shown in FIG. 17 according to the second embodiment of the present invention.

FIG. 17 is a circuit diagram showing an optical switch driver circuit according to a second embodiment of the present invention. This optical switch driver circuit is a preemphasis type. FIG. 18 is a waveform chart for illustrating the rising operating speed of the circuit shown in FIG. 17. FIG. 19 is a waveform chart for illustrating the falling operating speed of the circuit shown in FIG. 17. In FIG. 17, the same elements as those of FIG. 14 are referred to by the same reference numerals.

FIG. 17 shows a circuit that drives an SOA gate-type optical switch, using the high-speed operational amplifier 40 that has an output current capacity of 300 mA or more and has a settling time of approximately 2 ns. The operational amplifier 40 has its output connected to its inverting input so as to form a voltage follower circuit.

A resistor R23 and a capacitor C12 are connected in parallel between the positive terminal of the signal generator 41 and the non-inverting input of the operational amplifier 40. The non-inverting input of the operational amplifier 40 is grounded through a terminating resistor R21. The negative terminal of the signal generator 41 is grounded. Each of the resistors R21 and R23 has a resistance of, for example, 50Ω, and the capacitor C12 has a capacitance of, for example, 30 pF.

The delay equivalent circuit 42 including the inductors L2 and L3 and the capacitor C1, which are connected to the output of the operational amplifier 40, is a circuit component equivalent to the internal delay of an SOA chip. The switch equivalent circuit 43 includes the diode D1.

A square wave generated by the signal generator 41 is divided between the resistors R23 and R21. When the waveform rises, the high-frequency components of the square wave are transmitted by the capacitor C12, while the low-frequency components are attenuated by the impedance characteristics of the resistor R23 and the capacitor C12, so that a waveform with the emphasized high-frequency components is generated. This signal is amplified by the operational amplifier 40 to be transmitted through the delay equivalent circuit 42 to the switch equivalent circuit 43 serving as a load. At this point, the high-frequency components emphasized by the preemphasis circuit (the resistors R21 and R23 and the capacitor C12) at the input stage are attenuated by the delay equivalent circuit 42. By thus transmitting the intended original square wave and thereby driving the switch equivalent circuit 43, it is possible to perform driving at high speed.

Referring to FIG. 18, a fast overshoot voltage is caused in the output voltage waveform of the operational amplifier 40 indicated by a solid line. The transient overshoot component is smoothed when this output voltage of the operational amplifier 40 passes through the delay equivalent circuit 42 having a time constant of 3 ns. As a result, the voltage waveform after passing through the delay equivalent circuit 42 indicated by a broken line in FIG. 18 has an ideal fast rising edge. Therefore, this increase in speed is also seen in the current waveform of the switch equivalent circuit 43 indicated by a single-dot chain line in FIG. 18.

Further, referring to FIG. 19, the output voltage waveform of the operational amplifier 40 indicated by a solid line has a fast falling edge from 100 to 10% with no subsequent occurrence of ringing. This is because the operational amplifier 40 absorbs a reflected current or reverse current from the SOA chip since the operational amplifier 40 has low output impedance. This enables SOA driving with a sufficient extinction ratio ensured.

Since the input voltage of the operational amplifier 40 is used in this embodiment, it is possible to isolate the effect of the SOA chip serving as a load. Further, at a fall time, the backflow current of the charge stored in the diode D1, which is the parasitic capacitance of the SOA chip, can be absorbed into the operational amplifier 40 at high speed because the output of the operational amplifier is low in impedance, so that it is possible to prevent fall-time ringing. Further, since the output current of the signal generator 41, which is a front end device of the operational amplifier 40, is small, it is possible to achieve low power consumption.

Thus, according to one aspect of the present invention, it is possible to reduce the effect of the internal delay of a load and drive the load at high speed.

The present invention is not limited to the specifically disclosed embodiments, and variations and modifications may be made without departing from the scope of the present invention.

The present application is based on Japanese Priority Patent Application No. 2007-222741, filed on Aug. 29, 2007, the entire contents of which are hereby incorporated by reference.

What is claimed is:
1. A non-inverting amplifier circuit, comprising:
an operational amplifier; and
a preemphasis circuit connected between the operational amplifier and a signal source, the preemphasis circuit being configured to compensate for an internal delay of a load connected to an output of the operational amplifier by emphasizing a high-frequency component of a signal fed from the signal source,
wherein the preemphasis circuit comprises:
a first resistor connecting the signal source and a non-inverting input of the operational amplifier; and
a series circuit of an inductor and a second resistor, the series circuit connecting the non-inverting input of the operational amplifier to a predetermined potential, the inductor being directly connected to the second resistor.

2. A non-inverting amplifier circuit, comprising:

an operational amplifier; and a preemphasis circuit connected between the operational amplifier and a signal source, the preemphasis circuit being configured to compensate for an internal delay of a load connected to an output of the operational amplifier by emphasizing a high-frequency component of a signal fed from the signal source, wherein the preemphasis circuit comprises:
- a parallel circuit of a first resistor and a capacitor, the parallel circuit directly connecting the signal source and a non-inverting input of the operational amplifier; and
- a second resistor connecting the non-inverting input of the operational amplifier to a predetermined potential.

3. An optical switch driver circuit, comprising:

a non-inverting amplifier circuit, the non-inverting amplifier circuit including an operational amplifier; and a preemphasis circuit connected between the operational amplifier and a signal source, the preemphasis circuit being configured to compensate for an internal delay of a semiconductor optical amplifier connected to an output of the operational amplifier by emphasizing a high-frequency component of a signal fed from the signal source, wherein the preemphasis circuit includes a first resistor connecting the signal source and a non-inverting input of the operational amplifier; and a series circuit of an inductor and a second resistor, the series circuit connecting the non-inverting input of the operational amplifier to a predetermined potential, the inductor being directly connected to the second resistor.

4. An optical switch driver circuit, comprising:

a non-inverting amplifier circuit, the non-inverting amplifier circuit including an operational amplifier; and a preemphasis circuit connected between the operational amplifier and a signal source, the preemphasis circuit being configured to compensate for an internal delay of a semiconductor optical amplifier connected to an output of the operational amplifier by emphasizing a high-frequency component of a signal fed from the signal source, wherein the preemphasis circuit includes a parallel circuit of a first resistor and a capacitor, the parallel circuit directly connecting the signal source and a non-inverting input of the operational amplifier; and a second resistor connecting the non-inverting input of the operational amplifier to a predetermined potential.

* * * * *